May 30, 1972 H. L. RHODENIZER ET AL 3,666,549

METHOD OF MAKING ADDITIVE PRINTED CIRCUIT BOARDS AND PRODUCT THEREOF

Filed May 9, 1969 5 Sheets-Sheet 1

INVENTORS
HAROLD L. RHODENIZER
JOHN J. GRUNWALD
WILLIAM P. INNES

BY Steward & Steward

ATTORNEYS

INVENTORS
HAROLD L. RHODENIZER
JOHN J. GRUNWALD
WILLIAM P. INNES
BY Steward & Steward
ATTORNEYS INVENTORS
HAROLD L. RHODENIZER
JOHN J. GRUNWALD
WILLIAM P. INNES
BY Steward & Steward
ATTORNEYS INVENTORS
HAROLD L. RHODENIZER
JOHN J. GRUNWALD
WILLIAM P. INNES
BY Steward & Steward
ATTORNEYS INVENTORS
HAROLD L. RHODENIZER
JOHN J. GRUNWALD
WILLIAM P. INNES
BY Steward + Steward
ATTORNEYS United States Patent Office 3,666,549

Patented May 30, 1972

3,666,549

METHOD OF MAKING ADDITIVE PRINTED CIRCUIT BOARDS AND PRODUCT THEREOF

Harold L. Rhodenizer, Bethlehem, John J. Grunwald, New Haven, and William P. Innes, Cheshire, Conn., assignors to MacDermid Incorporated, Waterbury, Conn.

Filed May 9, 1969, Ser. No. 823,354
Int. Cl. C23c 3/02
U.S. Cl. 117—212 9 Claims

ABSTRACT OF THE DISCLOSURE

A method is disclosed for forming printed circuit boards using the additive process. Improvement over the prior art is obtained in respect to adhesion of the conductor metal circuit to a thermoset resin substrate. In the process, a nickel or copper clad thermoset resin substrate is stripped of all metal, activated (catalyzed), a resist pattern applied to obtain the desired circuit and a conductor metal deposited on the circuit area by electroless and/or electrodeposition to a final desired thickness. At one or more points in the process the board is heated or baked. Various types of circuit boards resulting from the process are also disclosed.

Figure 1:
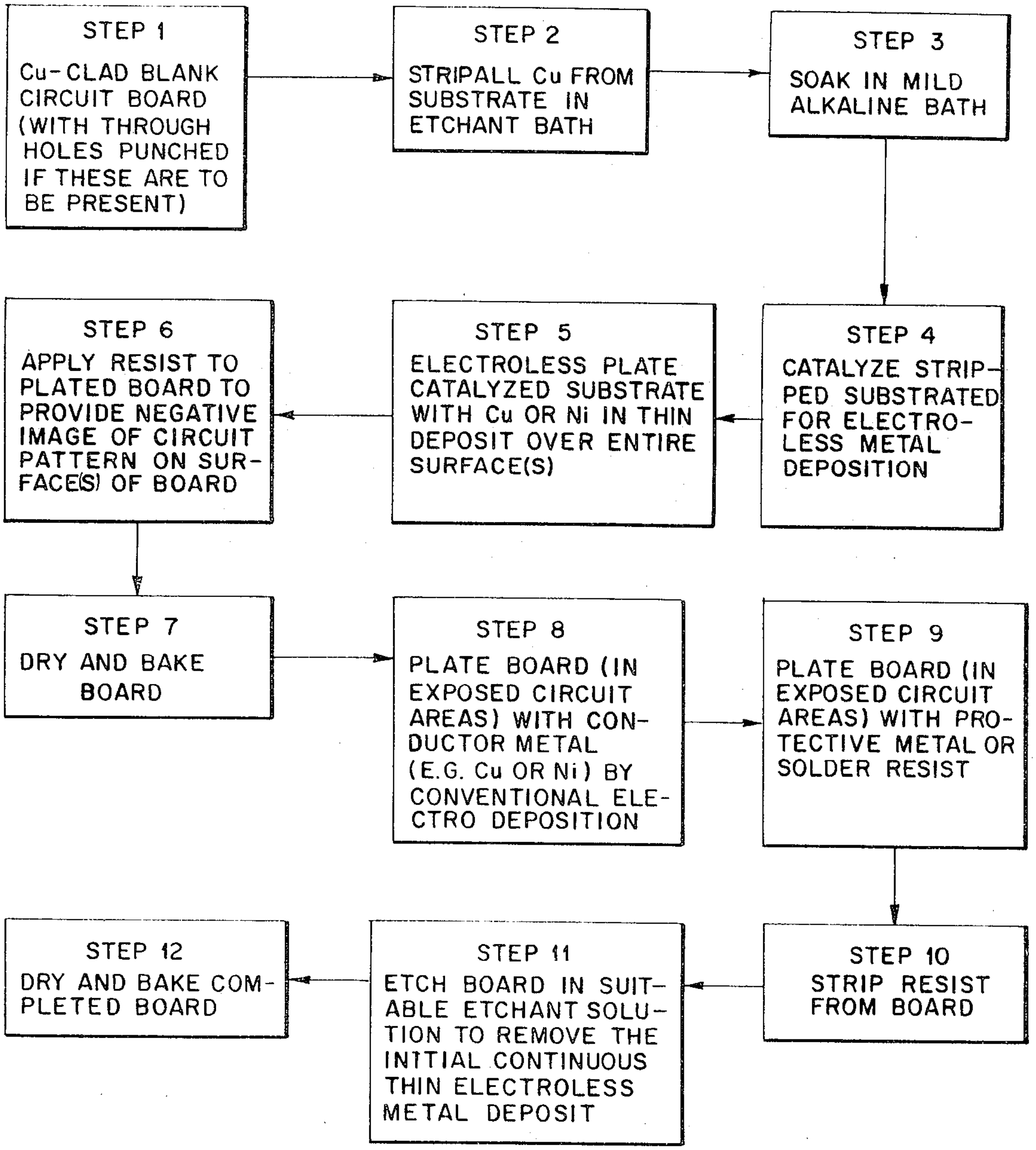

This invention relates to a method of making printed circuit boards by the additive process, and more particularly to a method for producing printed circuit boards with superior bonding of the printed metallic circuit to the surface of the non-conductive substrate. The invention is directed to a method which is applicable to thermoset resin substrates which are particularly desirable for printed circuit board use. Various intermediate structural arrangements in printed circuit boards are possible using the method of the invention and are described herein.

Two distinct methods of manufacture of printed circuit boards for use in electronic equipment have, in general, been proposed in the prior art. One is termed the "subtractive" method and is the one used predominantly at the present time. The other method is called the "additive" procedure.

The manufacture of the printed circuit by the "subtractive" method starts with a laminate or composite consisting of a sheet of insulating material as a base or substrate, one or both sides being covered with a thin copper foil on the order of 0.001 inch or 0.002 inch thick. The foil is secured to the insulating base by means of an appropriate adhesive or by the application of heat and pressure in forming the laminated structure. The substrate or insulating base used to support the conductive circuit is usually made in the form of a flat sheet of molded epoxy-glass or phenolic resin material.

After the configuration of the desired electric circuit to be printed on the board has been designed, the "art work" is prepared which consists of a positive or negative transparency or silk screen bearing the desired circuit image. In the photographic reproduction method, the copper-sheathed plastic substrate is covered with a photosensitive resist, this being generally a liquid polymeric preparation which includes light-sensitive initiators and becomes solvent-resistant after exposure to ultraviolet radiation of a particular frequency. A latent image of the desired circuit is formed in the photoresist on the surface of the board by exposure through the transparency, and this image is developed in an appropriate solvent which removes the unexposed photoresist material. Using the silk screen, a chemical resist is squeegeed through the screen onto the board to give the desired pattern. In this "subtractive" method, therefore, the resist coating formed on the board is a positive image of the desired circuit so that the copper foil to be retained on the surface of the board is covered with photoresist material. The remaining portion of the copper foil, corresponding to the non-circuit areas of the final printed board, is left unprotected and is then etched away in a suitable solution, commonly ferric chloride or an ammoniacal solution of the type described in U.S. Pat. No. 3,231,503. The resulting circuit board containing the desired circuit configuration is then treated in a suitable solvent to strip the remaining resist coating on the retained copper foil, and is ready for additional plating or solder application, mounting of accessory electronic components, etc.

In a modification of this procedure, where a circuit board is provided with copper laminates on both sides and it is desired to form conductor circuits on these opposite faces with electrical interconnection between certain areas on the opposite faces, through-holes are drilled or punched through the boards as required, and the walls of these holes are plated with a metal to electrically interconnect the opposed surface conductor areas. Therefore before the copper clad boards can be put through the "subtractive" method of forming the desired printed circuits on their opposite faces, they must be subjected to a series of operations designed to plate a thin deposit of copper, nickel, etc., on the walls of the through-holes to join the surface conductor areas. The procedure here is well-known in the art and generally involves punching the holes, cleaning the copper-clad faces of the laminate, light etching or pickling and then catalyzing, followed by electroless deposition (or in some cases by direct electrodeposition) of copper over the entire exposed surface, including the non-conductive walls of the through-holes in the plastic substrate as well of course as the copper-clad faces of the substrate. After applying a circuit pattern of organic or polymeric masking resist, the conductor areas (i.e. circuit areas) are electrolytically plated with conductor metal to desired thickness and then covered with a metallic resist (e.g. tin-lead). The organic resist is then stripped by a suitable solvent, leaving the non-circuit areas of copper exposed, and this is then removed by a suitable acid or alkali etchant solution.

A major drawback of the foregoing "subtractive" method arises from the occurrence during etching away of the non-circuit areas of the phenomenon known as "undercut" in the metal remaining on the board. Undercut is the term of art employed to describe the lateral undermining of the conductor area in the resulting circuit configuration formed on the surface of the board. In fact, this phenomenon of undercutting greatly limits the fineness or narrowness of the conductor areas that can be tolerated; that is, these conductor areas must be over-designed from a width standpoint to allow for such undercut. This of course impedes attempts toward further miniaturization of the circuit boards. Also, where the nature of the circuit requires the use of the heavier or thicker copper foil on the surface of the plastic substrate, a longer residence time of the board in the etching solution must be maintained, during which there is an inherent tendency for the resist material itself to be undermined and partially removed in some areas of the board, thereby causing rejects.

Thus the problem in following the so-called "subtractive" method of producing printed circuit boards is one of greatly limiting the design, insofar as space requirements are concerned, of the desired printed circuits.

An alternative to the "subtractive" process discussed above has been proposed heretofore, and is known as the "additive" method of manufacturing such boards. This procedure starts with a non-conductive board, free of any copper foil laminate, to which a masking resist circuit pattern is applied and by plating conductor metal only on the desired areas of the board. The procedure obviously presents a number of advantages over the "substractive" method and many attempts have been made to produce suitable additive circuit boards. To date, however, these attempts have not proved too satisfactory in commercial production. The major obstacle to a successful "additive" printed circuit board is the difficulty of obtaining adequate adhesion between the chemically deposited copper or other conductive metal and the dielectric substrate. One of the more recent procedures that has been developed is described in "Transactions of the Institute of Metal Finishing," 1968, vol. 46, pages 194–197. The procedure there described involves the successive steps of treating the surface of the bare substrate board with a "keying" agent, punching the board to provide the necessary through-holes, plating a very thin initial deposit of nickel over the entire surface using an electroless nickel bath, then applying and developing a resist to form a negative image of the desired circuit pattern, followed by additional metal plating by conventional electrodeposition techniques to build up the conductor portions of the circuit to the desired thickness. After this the resist is stripped and the printed circuit board is etched to completely strip away the initial, thin, electroless metal deposit from the non-circuit areas, leaving only the heavier plate, i.e. the circuit areas, on the board. The board is then treated in the usual way to provide a protective film of precious metal or lacquer on the printed conductor circuit, or alternatively to cover this with a solder coating to facilitate connection of the usual accessory electronic components incorporated into the finished circuit board.

The foregoing method has certain advantages, particularly in that it facilitates electrodeposition of the conductor circuit and avoids or reduces the need of further electroless plating operations. However, a difficulty with this method resides in its use of a "keying" agent which, although not fully identified in the foregoing article, appears to be a polymeric coating. Careful preparation and application of this coating material is required in order to obtain effective and consistent results. Furthermore, as in most cases where attempts have been made to use adhesives as intermediates for bonding copper or other conductor metals to a plastic substrate, there are always problems in obtaining proper dielectric properties of the adhesive, accurate and consistent reproducibility of the polymeric bonding material, and avoiding fragility or brittleness of the bond, to name but a few. It appears also that the reference process is better suited to thermo-plastic resin substrates rather than thermosetting substrates, although the latter are much preferred for electronic applications.

It is the primary contribution of this invention, accordingly to provide a method that obviates the use of polymeric adhesive coatings and yet produces satisfactory adhesion of the copper or other conductive metal to the dielectric substrate, more particularly to thermosetting resin substrates.

In brief, the procedure of this invention involves starting with a metal clad laminate of thermoset resin substrate having a sheath or film of copper or nickel bonded to it by heat and pressure in the manner commonly employed today in preparing blank circuit boards for use in the substractive method. In this case however, the metal sheath or film may be as thin as is practical to apply, and substantially thinner than that normally used in the past for circuit board manufacture, since this cladding will not be used for circuit-forming purposes in accordance with the present invention but will be stripped or etched completely from the board prior to application of any circuit. Following the stripping of the initial metal foil, the substrate is catalyzed in known manner in a tin-palladium catalyst solution, and the board is processed in either of two ways to provide an adherent conductor metal circuit on its surface. Under one procedure, the catalyzed board is electrolessly plated with a thin, initial deposit of conductor metal over its entire surface, followed by application of a circuit pattern of suitable resist to permit subsequent build-up by electrolytic or electroless deposition in the circuit areas of additional conductor metal to final desired thickness. Alternatively, the procedure may involve applying and developing a resist circuit pattern immediately following catalyzing, and then plating the circuit areas only with conductive metal by electroless plating technique, or even by direct electrolytic plating in some circumstances as described for example in U.S. Pat. No. 3,099,608, Radovsky et al.

Both procedures just described are satisfactory, each having some inherent advantages that may make it preferable to some operators over the other in a particular application. For example, the first procedure mentioned provides a means of facilitating electrodeposition in the formation of the conductor circuit pattern, and this is inherently less expensive than electroless deposition procedures. However, using this method requires a final brief etching step to remove the initial thin continuous electroless deposit of conductive metal after the build-up of the circuit has been completed.

Whichever of the two procedures here described is employed, it is an important aspect of this invention that the circuit board is heated or baked at one or more points in its development to promote effective bonding between the conductor metal and the resin substrate. Such heating or baking operation can be carried out at any one or more points, e.g.: following the catalyzing step, after application of the continuous initial thin conductor metal layer; after application of the resist; after development of the resist circuit pattern; or after completion of the circuit board, depending on which procedure is used. While such heating or baking is not required at all of these stages, it is always required at least once following the catalyzing stage and is instrumental in obtaining good adhesion.

While the mechanisms of better adhesion through starting with a metal clad laminate and then chemically stripping all the metal away before electroless deposition of the conductor metal circuit is begun is not yet well understood, it appears that some reaction involving or caused by an oxide film on the initial metal foil at the metal plastic interface, and subsequent stripping of the foil chemically, is the reason for greatly improved adhesion between the substrate and the conductive metal layer, providing peel strengths of at least 5 and as high as 25 pounds per inch. The heating or baking step mentioned above is, moreover, essential to the improved result.

FIGS. 1 through 6 inclusive represent block flow diagrams of the steps involved in several different procedures for preparing circuit boards in accordance with this invention.

Discussion of some of the procedures that can be followed will be helpful to a further understanding of the invention.

EXAMPLE I

With reference to FIG. 1 of the accompanying drawings, the various major steps in the preparation of a completed printed circuit board are given in flow diagram form. It will of course be understood that conventional intermediate treatment steps, such as water rinsing where required, have been omitted from this flow diagram but their use as needed will be obvious to those experienced in this art.

Starting with Step 1, a copper-clad board, with through-holes already punched in it if these are to be used in the completed circuit board, is cleaned of any surface grime. Molded thermoset resin of glass-epoxy or phenolic base type generally is desired as the substrate for dielectric properties, as well as resistance to structural deformation or warping due to temperature and humidity variations.

In Step 2, the board is dipped in or otherwise contacted with a copper etching solution to completely strip the metal cladding from the surface of the board. Any of the usually employed copper etchant solutions can be employed. Typically suitable solutions include ferric chloride, chromic or chromic-sulfuric acid, ammoniacal chlorite or persulfate solutions, and sometimes nitric acid solutions (approximately 50% by volume of commercial nitric acid). In general, all stripping solutions are operative in the practice of the present invention so long as they do not cause excessive attack of the non-conductive substrate.

After a suitable water rinse and submersion at Step 3 in a mild alkaline bath, the board is catalyzed at Step 4 by either the two-step activation procedure using stannous chloride in hydrochloric acid, followed by a dip in palladium chloride in hydrochloric acid, a well-known procedure as described in the previously-mentioned reference article; or the catalyst may be effected by the one-step procedure employing a tin-palladium hydrosol such as that disclosed in U.S. Pat. No. 3,532,518.

Usually also it is desirable to subject the catalyzed board to an accelerating solution, for example a dilute solution of suitable acid or alkali.

After rinsing, the board is then plated at Step 5 in an electroless metal plating bath of copper or nickel. Any of the commercially available electroless copper or nickel baths is suitable. Typical compositions of such baths are shown in U.S. Pats. Nos. 2,874,072; 3,075,855 and 3,095,309 for copper; and 2,532,283; 2,990,296 and 3,062,666 for nickel. The metal deposit here desired is only a very thin but continuous layer of the order of 10 to 30 millionths of an inch over the entire surface of the board, as well as the wall surfaces of any through-holes that may be present. Its purpose is merely to provide an initial conductive surface which will interconnect all of the circuit areas to be printed on the board in order to facilitate electrodeposition of such circuit areas in subsequent steps.

Again after adequate rinsing, the board is advanced at Step 6 to a station where a resist coating is applied to the surface or surfaces on which the conductive circuits are to be formed. Here again the operator is afforded a choice of several methods in the selection and application of the resist coating, all of which are known and conventional in the art. Under one method the circuit design may be outlined by a chemical resist applied by squeegeeing it through an appropriate silk screen designed to produce coverage of the non-circuit areas of the board while leaving the circuit areas themselves free of resist material. Under the alternate resist application procedure, a positive or negative photoresist composition is applied to the entire surface of the board and this is exposed to a light source through a suitable film of the desired circuit configuration, and the photoresist material is then developed by an appropriate solvent to strip away the exposed or unexposed photoresist material on the board, depending on the system used. In either case the board is then dried at Step 7 to cause the resist coating to firmly adhere to the surface. While heating may be necessary for setting the resist composition so that it will withstand the subsequent operations performed on the board, it also may serve as the baking operation referred to hereinabove as being an integral part of this invention. In this event, it is preferred to heat the board to a temperature of approximately 220° F. for a period of about 30 minutes. Considerable latitude in the temperature and time is possible, and in general lower temperatures will require longer times and vice versa. Practical operating conditions dictate the use of baking temperatures substantially above ambient, and preferable at or above the boiling point of water if atmospheric pressure is maintained. Obviously the temperature employed cannot be so high as to cause charring of the resin substrate.

In this Example I, the board is now ready at Step 8 for plating of the exposed circuit areas to build up a desired thickness of conductor metal in those areas. By providing the initial continuous thin metal deposit, conventional electrodeposition of additional conductor metal or metals on the circuit areas is greatly facilitated since a single connection at any point on the conductive surface of the board will effect electrodeposition of metal at all exposed circuit areas when the board is made the cathode in a conventional electrolytic plating bath. Copper or nickel can be conveniently used as the conductor metal, and the plating operation is continued to build up a sufficiently thick deposit of such metal to meet the requirements of the electronic circuit in which the board is used. Although as indicated copper or nickel may both serve adequately there is some indication at present that electroless nickel performs better in many instances.

Subsequent plating of the circuit areas in Step 9 with a protective metal such as gold, silver, or with solder as a resist or to facilitate subsequent attachment of accessory electronic components to the board, can also be effected by electrochemical deposition from suitable metal plating solutions. After the conductor circuit has been completely built up, the board is then subjected at Step 10 to a stripping solution to remove the chemical or photochemical resist from the non-circuit areas. This leaves the surface of the board still covered with the thin initial conductor metal deposit over the entire surface. This coating is then removed at Step 11 by immersing the board in a suitable etchant, such as dilute nitric acid, to strip the noncircuit areas of any conductive metal. The protective metal coating previously applied to the circuit areas prevents or impedes any substantial attack of the etchant on those areas during this step. It is important therefore that an etchant be selected which does not appreciably attack this protective metal coating.

The finished board is then rinsed, dried and baked at Step 12. If the procedure followed has not incorporated baking the board at approximately 220° F. for 30 minutes at one of the earlier steps, this can take place at this point in the process.

EXAMPLE II

Figure 2:
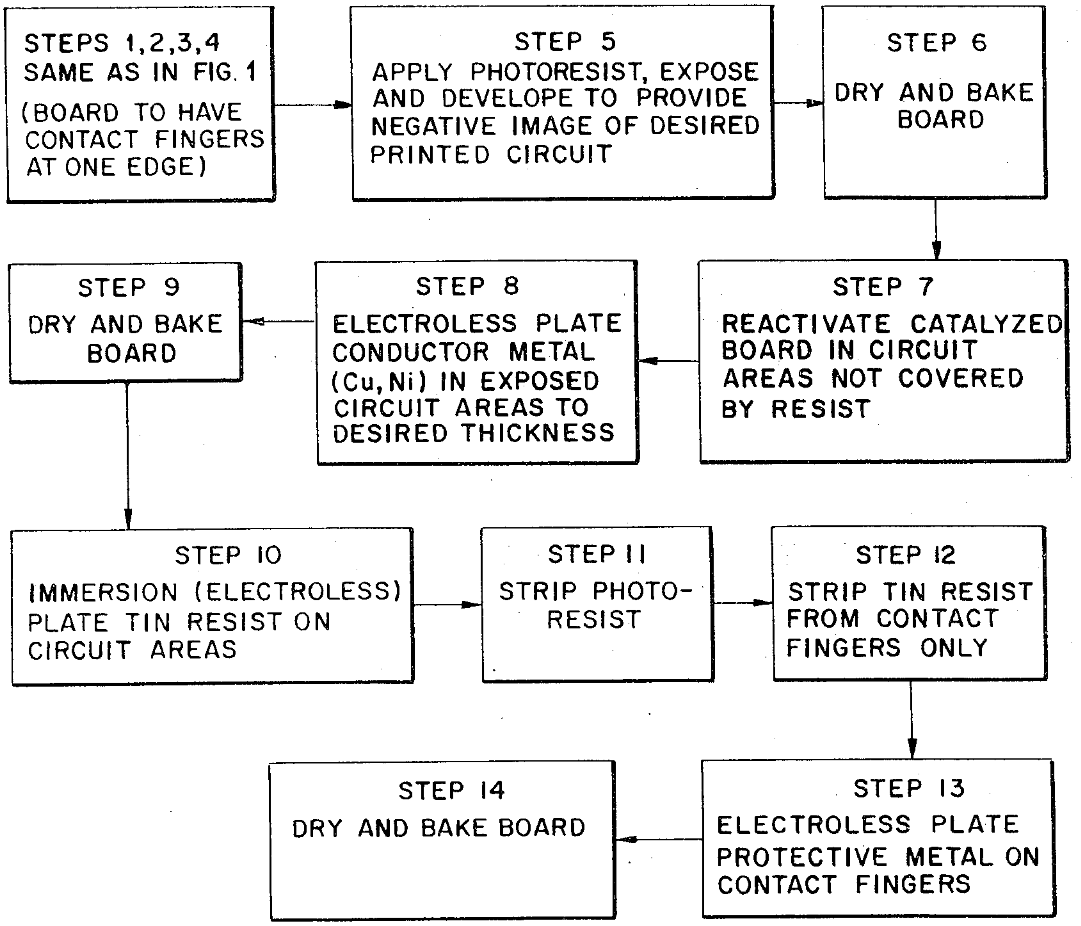

A modified procedure is shown in the flow diagram of FIG. 2. Here again the initial metal-clad board is stripped of its initial metal foil, rinsed and soaked in a mild alkaline bath and catalyzed for electroless metal deposition, all as in the first four steps of Example I. In this Example II, the board is then coated at Step 5 with a photoresist and the desired circuit configuration is exposed through a positive transparency and the photoresist composition developed to provide negative image of the desired printed circuit, as before. The board is dried, baked at Step 6 and preferably is subjected to a dilute sulfuric acid solution at Step 7 to reactivate the exposed catalyzed resin surface in the circuit areas. Electroless nickel or copper at Step 8 is then deposited in the exposed circuit areas to the total desired thickness, and the board again dried and baked at Step 9. An immersion coating of tin or solder alloy is applied at Step 10 to the exposed conductor or circuit area, and the photoresist is stripped from the non-circuit area using an appropriate solvent for the particular resist material employed. This provides a finished board unless it is desired to further plate contact finger areas commonly incorporated in a typical circuit board with a precious metal such as gold or silver to improve the contact surface. In this event, the photoresist is stripped at Step 11 and the tin resist is then stripped at Step 12 from the contact finger areas and the board subjected to further electroless plating at Step 13 in a gold or silver electroless plating bath. Intervening reactivation steps may be necessary here if the underlying conductor metal previously deposited is not sufficiently catalytic to the precious metal electroless baths to effect autodeposition. Again the board is dried and baked at Step 14, and if it has not previously been submitted to an elevated baking operation of the type described above, this step may be included at this point.

EXAMPLE III

Figure 3:
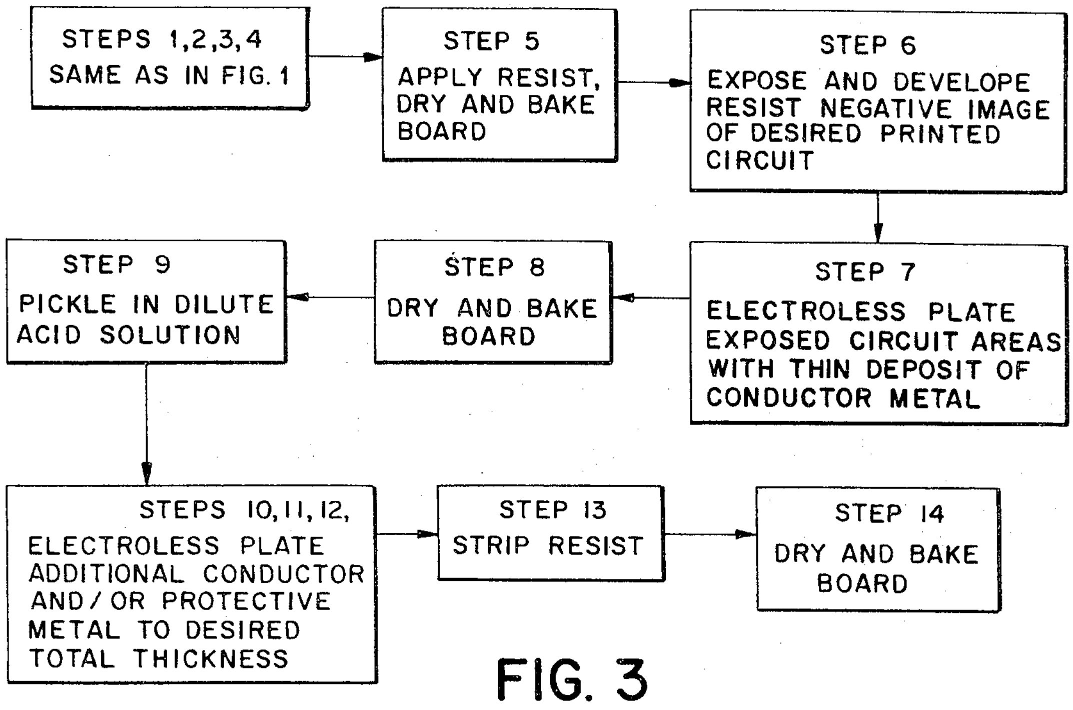

The procedure illustrated in FIG. 3 is essentially similar to that shown in FIG. 2, but in this instance the resist coating at Step 5 is baked before exposure and development. After development of the resist (Step 6) only a very thin (10 to 30 millionths of an inch) deposit of conductor metal is deposited initially from an electroless plating bath of the metal (Step 7), and the board is then dried and baked at approximately 220° F. for 30 minutes (Step 8). The board is pickled in dilute 10% sulfuric acid solution (Step 9) to reactivate the initial conductor metal deposit for subsequent electroless plating of copper, nickel and gold in that order (Steps 10, 11, 12), followed by stripping of the resist composition (Step 13) and further drying and baking of the finished board.

EXAMPLE IV

Figure 4:
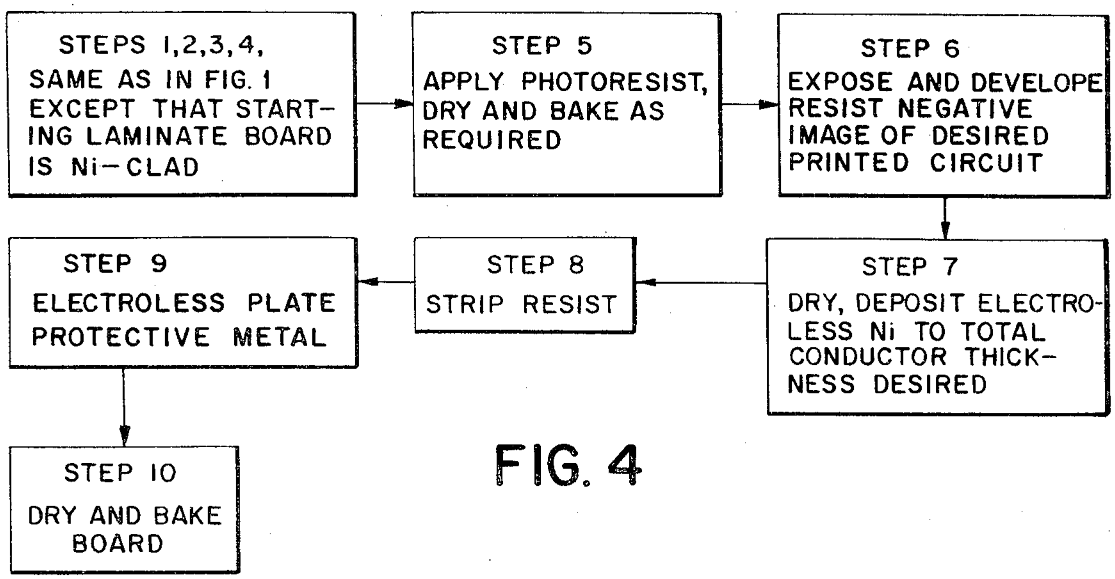

An all-nickel conductor circuit is produced in this example, as diagrammatically shown in FIG. 4. The same general sequence of steps is otherwise employed.

EXAMPLE V

Figure 5:
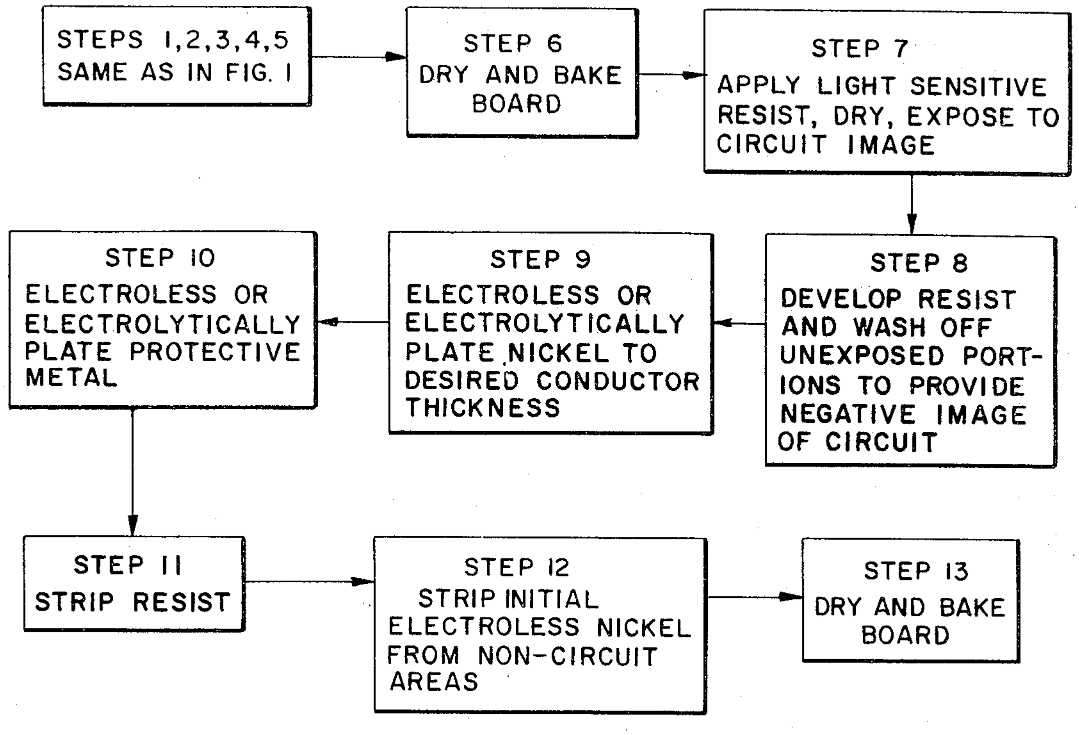
Figure 6:
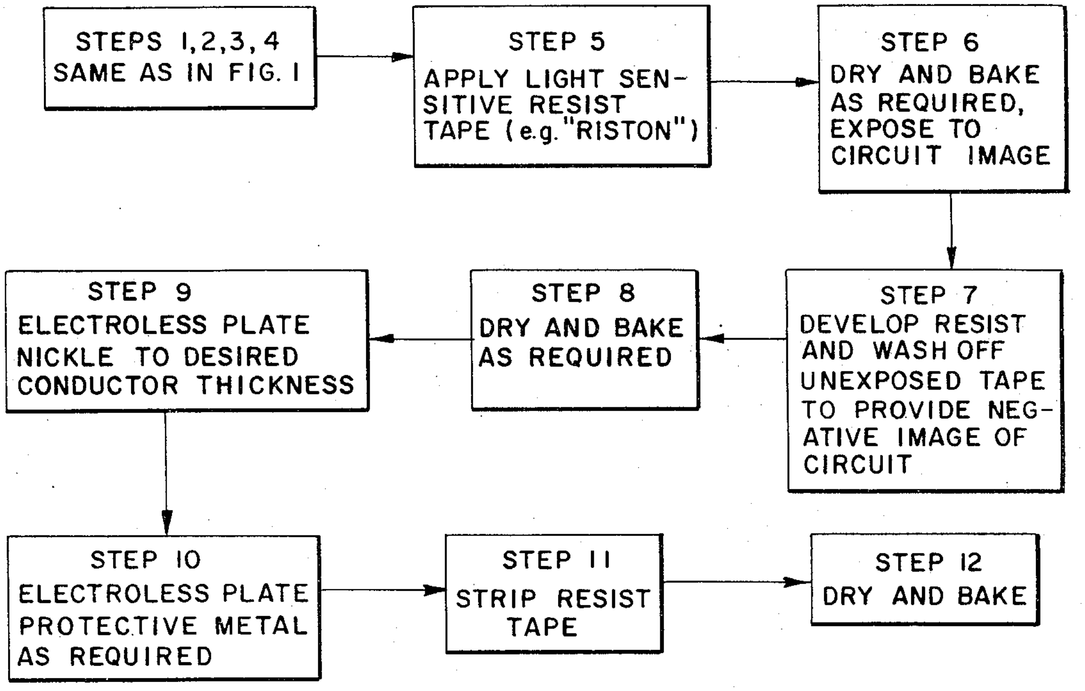

Another example of an all-nickel printed circuit is illustrated by the sequence of steps shown in FIG. 5. The procedure is otherwise essentially the same as that of Example I.

EXAMPLE VI

This illustrates a sequence employing only electroless metal deposition technique in building up the desired circuit, and a different type of resist.

What is claimed is:

1. The method of preparing a printed circuit board which comprises first providing a laminated composite comprising a sheet of polymerized thermoset epoxy or phenolic resin as a non-conductive substrate and a conductive sheet metal foil bonded to a surface thereof, chemically stripping all the metal foil from said composite in an etchant solution capable of dissolving the metal of the composite to re-expose the substrate surface, catalyzing the re-exposed substrate surface and then plating all of said surface with a conductor metal, and heating the plated substrate at least once subsequent to the catalyzing step to raise the temperature of the plated substrate above ambient but substantially below that at which charring of the resin substrate occurs.

2. The method of claim 1, wherein the board is heated to approximately 220° F. for 30 minutes.

3. The method of claim 2, wherein the board is heated after both the catalyzing and plating steps.

4. The method of claim 1, wherein the metal foil of the starting composite is a member selected from the group consisting of copper and nickel.

5. The method of claim 4, which comprises, in the sequence of steps immediately following catalyzation, electrolessly plating an initial thin deposit of a metal selected from the group consisting of copper and nickel to a thickness of about 10 to 30 millionths of an inch over the whole surface, applying a masking resist pattern in the configuration of the desired circuit, drying and baking the substrate, electroplating said substrate with additional conductor metal to build up a desired total thickness in the area of said desired circuit configuration, plating a metallic resist to the exposed conductor metal from a solution of the metal resist, stripping the masking resist from the noncircuit portion of the surface, etching away all of the exposed initial electroless deposit, stripping the metallic resist from selected portions of the conductor circuit, plating a protective metal of the class consisting of gold, silver and nickel on said selected portions of the conductor circuit, and baking the completed circuit board.

6. The method of claim 1, which comprises, in the sequence of steps immediately following catalyzation, applying a masking resist pattern in the configuration of the desired circuit to be printed on said board, drying and baking the board, reactivating the exposed circuit area by contacting it with dilute acid solution, electrolessly plating said exposed circuit area with at least one conductive metal to a desired thickness, drying and baking the circuit board, stripping the masking resist from the noncircuit area of the surface, and baking the completed circuit board.

7. The method of claim 1, wherein catalyzation of the substrate surface is effected by the one-step procedure employing an acid tin-palladium hydrosol resulting from reduction of an aqueous hydrochloric acid solution of a palladium salt by a stannous salt and in which an excess of stannous ions is present.

8. The method of claim 5, wherein catalyzation of the substrate surface is effected by the one-step procedure employing an acid tin-palladium hydrosol resulting from reduction of an aqueous hydrochloric acid solution of a palladium salt by a stannous salt and in which an excess of stannous ions is present.

9. The method of claim 6, wherein catalyzation of the substrate surface is effected by the one-step procedure employing an acid tin-palladium hydrosol resulting from reduction of an aqueous hydrochloric acid solution of a palladium salt by a stannous salt and in which an excess of stannous ions is present.

References Cited

UNITED STATES PATENTS

| | | | |
|---|---|---|---|
| 2,849,298 | 2/1958 | Werberig | 156—17 X |
| 2,934,479 | 4/1960 | Deer | 96—35 UX |
| 3,006,819 | 10/1961 | Wilson et al. | 112—212 X |
| 3,011,920 | 12/1961 | Shipley | 106—1 |
| 3,212,918 | 10/1965 | Tss et al. | 117—47 X |
| 3,245,826 | 4/1966 | Luce et al. | 117—47 |
| 3,293,109 | 12/1966 | Luce et al. | 117—212 X |
| 3,481,777 | 12/1969 | Spannhake | 117—212 |
| 3,522,085 | 7/1970 | Watanuke | 117—212 |
| 3,240,602 | 3/1966 | Johnston | 96—36.2 |
| 3,192,136 | 6/1965 | Reid | 96—36.2 |

RALPH S. KENDALL, Primary Examiner

U.S. Cl. X.R.

96—36.2; 117—213, 47 A; 204—38 B